United States Patent
Hong (10) Patent No.: US 9,570,702 B2
(45) Date of Patent: Feb. 14, 2017

(54) DISPLAY APPARATUS WITH A SEAL INCLUDING A GAS HOLE ADJACENT TO A DISPLAY PORTION AND METHOD OF MANUFACTURING THE SAME

(71) Applicant: SAMSUNG DISPLAY CO., LTD., Yongin, Gyeonggi-Do (KR)

(72) Inventor: Sang-Min Hong, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 32 days.

(21) Appl. No.: 14/478,244

(22) Filed: Sep. 5, 2014

(65) Prior Publication Data

US 2015/0311472 A1    Oct. 29, 2015

(30) Foreign Application Priority Data

Apr. 28, 2014 (KR) .................. 10-2014-0050925

(51) Int. Cl.
  *H01L 51/52* (2006.01)
  *H01L 27/12* (2006.01)
  *H01L 27/32* (2006.01)

(52) U.S. Cl.
  CPC ....... *H01L 51/5246* (2013.01); *H01L 27/1214* (2013.01); *H01L 27/1259* (2013.01); *H01L 27/3244* (2013.01); *H01L 51/525* (2013.01)

(58) Field of Classification Search
  CPC ............................ H01L 51/5246; H01L 51/525
  See application file for complete search history.

(56) References Cited

U.S. PATENT DOCUMENTS

| | | | |
|---|---|---|---|
| 6,580,094 B1 * | 6/2003 | Yamazaki | G09G 3/3275 257/344 |
| 7,538,488 B2 | 5/2009 | Kwak | |
| 7,826,025 B2 | 11/2010 | Chen et al. | |
| 7,837,530 B2 * | 11/2010 | Park | H01L 51/5246 445/24 |
| 7,915,821 B2 | 3/2011 | Kang | |
| 8,049,412 B2 * | 11/2011 | Kwak | H01L 27/3276 313/504 |
| 2003/0094615 A1 * | 5/2003 | Yamazaki | H01L 27/12 257/72 |
| 2004/0135941 A1 | 7/2004 | Nam et al. | |
| 2005/0190335 A1 | 9/2005 | Maruyama et al. | |
| 2010/0051949 A1 | 3/2010 | Yamazaki et al. | |

(Continued)

FOREIGN PATENT DOCUMENTS

JP    2012-252344    12/2012
KR    10-2004-0049510 A    6/2004

(Continued)

*Primary Examiner* — Anh Mai
(74) *Attorney, Agent, or Firm* — Lee & Morse, P.C.

(57) ABSTRACT

Provided are a display apparatus and a method of manufacturing the same. The display apparatus includes a display substrate arranged with a display portion including a display device; a sealing substrate disposed to face the display substrate; and a sealing portion that bonds the display substrate and the sealing substrate and surrounds the display portion. The sealing portion includes a first sealing portion that includes a sealing material and an insulating layer that includes at least one first opening; and a second sealing portion that is disposed outside the first sealing portion and includes at least one gas hole.

13 Claims, 8 Drawing Sheets

(56) References Cited

U.S. PATENT DOCUMENTS

| | | | |
|---|---|---|---|
| 2012/0043880 A1 | 2/2012 | Lee | |
| 2015/0060893 A1* | 3/2015 | Cho | H01L 51/5246 257/88 |
| 2015/0084498 A1* | 3/2015 | Choi | H01L 51/5246 313/504 |
| 2015/0102293 A1* | 4/2015 | Cho | H01L 33/56 257/40 |
| 2015/0102295 A1* | 4/2015 | Hong | H01L 51/5246 257/40 |
| 2015/0102300 A1* | 4/2015 | Gong | H01L 51/5246 257/40 |
| 2015/0108438 A1* | 4/2015 | Kim | H01L 27/3258 257/40 |
| 2015/0171367 A1* | 6/2015 | Moon | H01L 51/5253 257/40 |
| 2015/0179721 A1* | 6/2015 | Lee | H01L 27/3258 257/40 |
| 2015/0221708 A1* | 8/2015 | Go | H01L 51/5246 257/40 |
| 2015/0236297 A1* | 8/2015 | Hong | H01L 51/5246 257/40 |
| 2016/0013441 A1* | 1/2016 | Hong | H01L 51/5246 257/40 |
| 2016/0029502 A1* | 1/2016 | Lee | H05K 5/065 361/748 |
| 2016/0035997 A1* | 2/2016 | Oh | H01L 51/5246 257/40 |

FOREIGN PATENT DOCUMENTS

| | | |
|---|---|---|
| KR | 10-2005-0082260 A | 8/2005 |
| KR | 10-2005-0082958 A | 8/2005 |
| KR | 10-2006-0032089 A | 4/2006 |
| KR | 10-2006-0043296 A | 5/2006 |
| KR | 10-2009-0071318 A | 7/2009 |
| KR | 10-2012-0017928 A | 2/2012 |

* cited by examiner

DISPLAY APPARATUS WITH A SEAL INCLUDING A GAS HOLE ADJACENT TO A DISPLAY PORTION AND METHOD OF MANUFACTURING THE SAME

CROSS-REFERENCE TO RELATED APPLICATION

Korean Patent Application No. 10-2014-0050925, filed on Apr. 28, 2014, in the Korean Intellectual Property Office, and entitled: "Display Apparatus and Method of Manufacturing the Same," is incorporated by reference herein in its entirety.

BACKGROUND

1. Field

One or more embodiments relate to a display apparatus and a method of manufacturing the same.

2. Description of the Related Art

Display apparatus that include thin-film transistors (TFTs), such as an organic light-emitting display device or a liquid crystal display device, are receiving attention as display apparatus for mobile devices, such as, for example, digital cameras, video camera, camcorders, portable information terminals, or smart phones.

SUMMARY

Embodiments may be realized by providing a display apparatus, including a display substrate arranged with a display portion including a display device; a sealing substrate disposed to face the display substrate; and a sealing portion that bonds the display substrate and the sealing substrate and surrounds the display portion. The sealing portion includes a first sealing portion that includes a sealing material and an insulating layer that includes at least one first opening; and a second sealing portion that is disposed outside the first sealing portion and includes at least one gas hole.

The at least one first opening may be connected to the at least one gas hole by a connection hole.

An area of the at least one gas hole may be larger than an area of the at least one first opening.

The insulating layer may include a plurality of first insulating layer openings, and each of the first insulating layer openings may be connected to an adjacent first opening through a connection hole.

The first sealing portion may further include a metal pattern layer including at least one second opening.

The insulating layer may include a plurality of first openings that are formed inside the second opening.

The display portion may include a thin-film transistor including an active layer, a gate electrode, a source electrode, and a drain electrode, and the metal pattern layer may be formed of a same material and on a same layer as the gate electrode.

The display portion may include a first thin-film transistor including a first active layer, a first gate electrode, a first source electrode, and a first drain electrode, and a second thin-film transistor including a second active layer, a second gate electrode, a second source electrode, and a second drain electrode, a gate insulating film may be disposed between the first gate electrode and the second gate electrode, and the metal pattern layer may be formed of a same material and a same layer as the first or second gate electrode.

The first sealing portion may further include a first metal pattern layer includes at least one second opening; and a second metal pattern layer including a third opening on the first metal pattern layer.

The display portion may include a first thin-film transistor including a first active layer, a first gate electrode, a first source electrode, and a first drain electrode, and a second thin-film transistor including a second active layer, a second gate electrode, a second source electrode, and a second drain electrode, a gate insulating film may be disposed between the first gate electrode and the second gate electrode, the first metal pattern layer may be formed of a same material and on a same layer as the first gate electrode, and the second metal pattern layer may be formed of a same material and on a same layer as the second gate electrode.

The sealing material may be hardened by a laser.

An additional sealing material may be disposed on the second sealing portion.

Embodiments may be realized by providing a method of manufacturing a display apparatus, the method including forming a display portion including at least one display device on a display substrate; applying a sealing material on a sealing portion disposed to surround the display portion; aligning a sealing substrate to face the display substrate; and hardening the sealing material by using a laser. The sealing portion includes a first sealing portion that includes the sealing material and an insulating layer including at least one first opening; and a second sealing portion that is disposed outside the first sealing portion and includes at least one gas hole. The sealing material is applied on the first sealing portion.

The hardening of the sealing material may be performed under a vacuum environment.

The method may further include applying an additional sealing material on the second sealing portion.

The at least one first opening may be connected to the at least one gas hole via a connection hole.

An area of the at least one gas hole may be larger than an area of the at least one first opening.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In drawings, like reference numerals refer to like elements throughout and overlapping descriptions shall not be repeated.

While such terms as "first", "second", etc., may be used to describe various components, such components must not be limited to the above terms. The above terms are used only to distinguish one component from another.

An expression used in the singular encompasses the expression of the plural, unless it has a clearly different meaning in the context.

In the present specification, it is to be understood that the terms such as "including" or "having," etc., are intended to indicate the existence of the features or components, and are not intended to preclude the possibility that one or more other features or components may exist or may be added.

It will be understood that when a component or layer is referred to as being "on" another component or layer, the component or layer can be directly on another component or layer or intervening component or layers. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

In drawings, for convenience of description, sizes of components may be exaggerated for clarity. For example, since sizes and thicknesses of components in drawings are arbitrarily shown for convenience of description, the sizes and thicknesses are not limited thereto.

As used herein, the term "and/or" includes any and all combinations of one or more of the associated listed items. Expressions such as "at least one of," when preceding a list of elements, modify the entire list of elements and do not modify the individual elements of the list.

Figure 1:
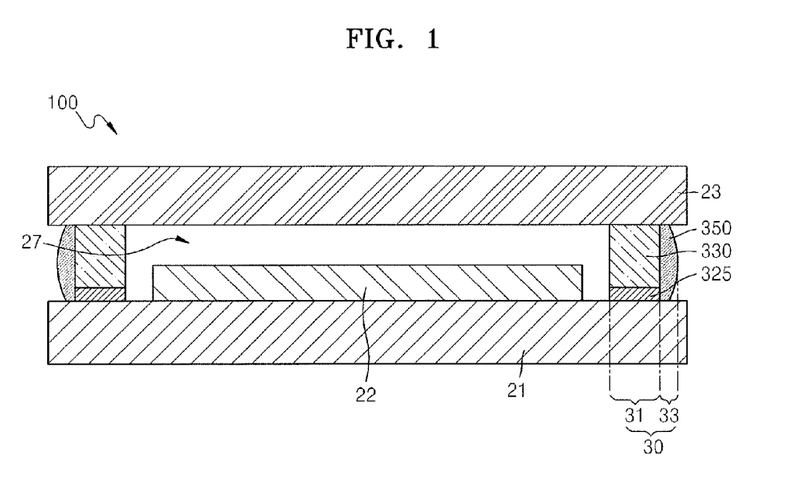
FIG. 1 illustrates a cross-sectional view schematically illustrating a display apparatus according to an embodiment.

FIG. 1 illustrates a cross-sectional view schematically illustrating a display apparatus 100 according to an embodiment.

Referring to FIG. 1, the display apparatus 100 may include a display portion 22 provided on a display substrate 21 and may include a display device, and a sealing substrate 23 sealing the display portion 22. The display apparatus 100 may include a sealing portion 30 that bonds the display substrate 21 and the sealing substrate 23.

The display portion 22 arranged with the display device may be disposed on the display substrate 21. The display device may be an organic light-emitting device (OLED), liquid crystal display device, or an electrophoretic display device, which may be capable of forming an image.

The sealing substrate 23 may be formed of a transparent material, an image may be formed from the display portion 22, and the sealing substrate 23 may block oxygen and moisture from penetrating into the display portion 22. In some embodiments, the sealing substrate 23 may be an on-cell touch screen panel that may have a touch screen pattern to function as a touch panel.

A polarizing film, a color filter, or a protection window (not shown) may be further disposed on the sealing substrate 23.

An inner space 27 between the display substrate 21 and the sealing substrate 23 may be sealed as edges of the display substrate 21 and sealing substrate 23 are combined by the sealing portion 30. A moisture absorbent or a filler may be disposed in the inner space 27.

The sealing portion 30 may surround the display portion 22. The sealing portion 30 may be a region where the display substrate 21 and the sealing substrate 23 are bonded to each other, may prevent oxygen and moisture from flowing into the display portion 22, and may improve apparatus intensity, for example, by bonding the display substrate 21 and the sealing substrate 23.

The sealing portion 30 may include a first sealing portion 31 adjacent to the display portion 22, and a second sealing portion 33 that may be disposed outside the first sealing portion 31.

Figure 2:
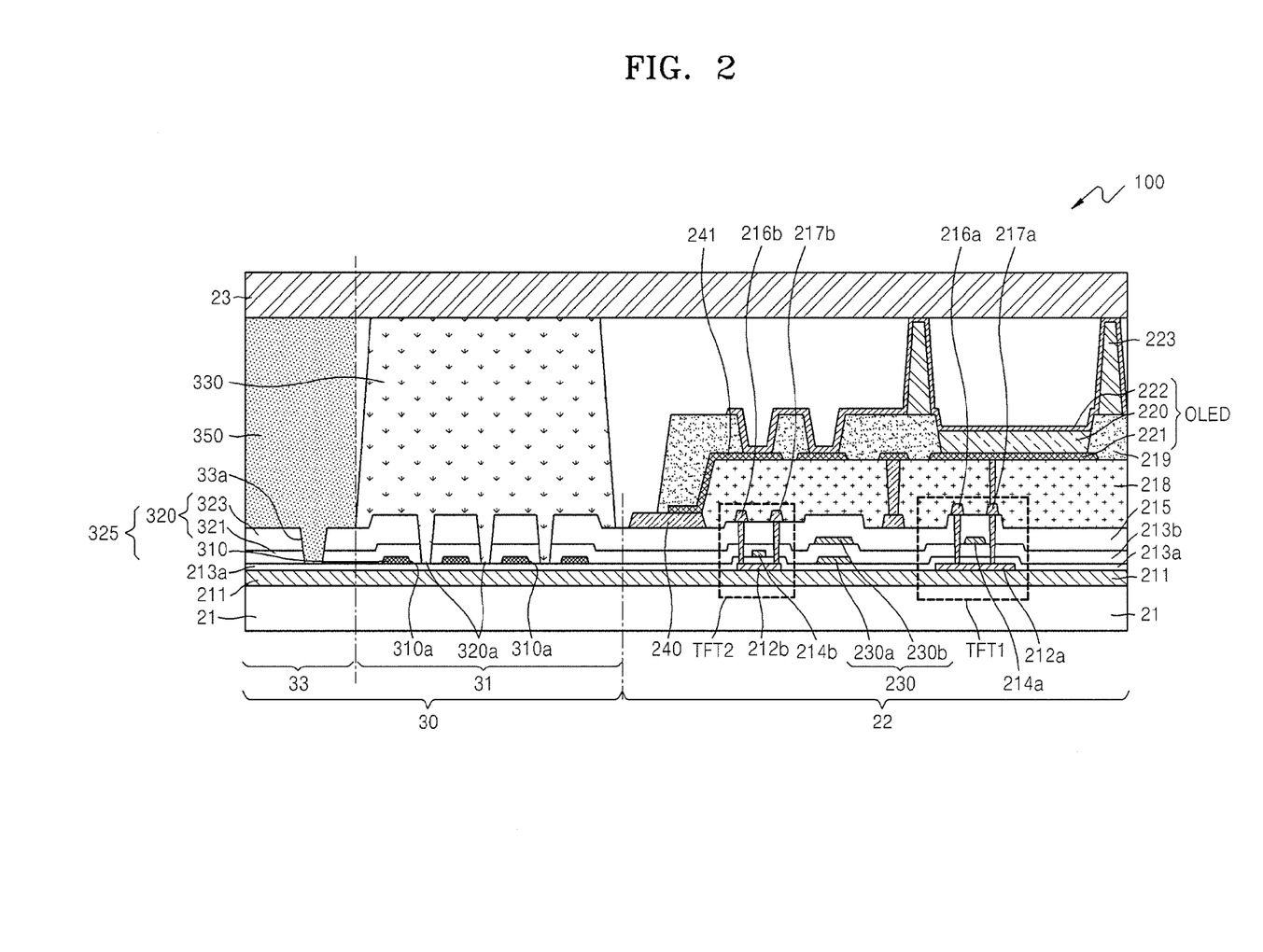
FIG. 2 illustrates a cross-sectional view illustrating in detail the display apparatus of FIG. 1.

A sealing material 330 may be disposed in the first sealing portion 31. The sealing material 330 may be a material hardened by a laser. For example, the sealing material 330 may be formed of frit. A bonding assistant layer 325 for reinforcing a bond between the sealing material 330 and the display substrate 21 may be further disposed on the sealing portion 30. With reference to FIG. 2, the bonding assistant layer 325 may include an insulating layer 320 including at least one first opening 320a. The bonding assistant layer 325 may include a metal pattern layer 310. A structure and functions of the bonding assistant layer 325 will be described in detail below.

The second sealing portion 33 may be disposed outside the first sealing portion 31. Outside of the first sealing portion 31 may be a direction where the display portion 22 is not placed based on the first sealing portion 31.

With further reference to FIG. 2, the second sealing portion 33 may include a gas hole 33a connected to the first opening 320a. An additional sealing material 350 may be disposed in the second sealing portion 33. When the additional sealing material 350 is included, the gas hole 33a may be filled by the additional sealing material 350.

The additional sealing material 350 may be used to assist bonding intensity of the sealing material 330, and may be formed of a material having a relatively high adhesive strength. In some embodiments, the additional sealing material 350 may be formed of an organic sealant, such as urethane-based resin, epoxy-based resin, or acryl-based resin, or an inorganic sealant, such as silicon. An example of a urethane-based resin is urethane acrylate. Examples of an acryl-based resin include butylacrylate and ethylhexylacrylate. In some embodiments, the additional sealing material 350 may be formed of a material that may be hardened by heat.

A structure of the sealing portion 30 will now be described in detail with reference to FIGS. 2 and 3.

Figure 3:
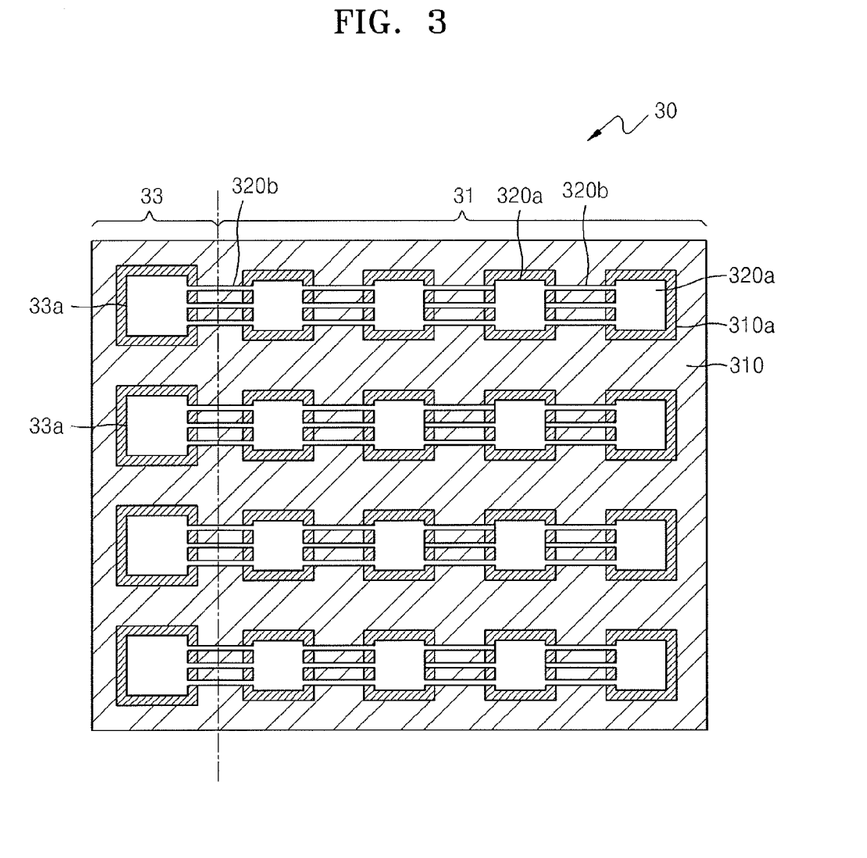
FIG. 3 illustrates a plan view of a sealing portion of a display apparatus, according to an embodiment.

FIG. 2 illustrates a cross-sectional view illustrating in detail the display apparatus 100 of FIG. 1, and FIG. 3 illustrates a plan view of the sealing portion 30 of the display apparatus 100, according to an embodiment.

Referring to FIG. 2, the display apparatus 100 may include the display substrate 21, the sealing substrate 23, the display portion 22 on the display substrate 21, and the sealing portion 30. A buffer film 211 may be further disposed on the display substrate 21.

The display substrate 21 may be formed of a transparent glass material mainly containing $SiO_2$. In an embodiment, a material of the display substrate 21 may be a ceramic material, a transparent plastic material, or a metal material.

The sealing substrate 23 may be formed of a transparent material, an image may be formed from the display portion 22, and the sealing substrate 23 may block oxygen and moisture from penetrating into the display portion 22. In some embodiments, a touch pattern electrode may be patterned on the sealing substrate 23, and the sealing substrate 23 may operate as a touch panel. A polarizing film, a color filter, or a protection window (not shown) may be further disposed on the sealing substrate 23.

The buffer film 211 may prevent impure ions from being diffused on a top surface of the display substrate 21, prevent moisture or external atmosphere from penetrating into the display substrate 21, and flatten a surface of the display substrate 21. In some embodiments, the buffer film 211 may be formed of an inorganic material, such as silicon oxide, silicon nitride, silicon oxynitride, aluminum oxide, aluminum nitride, titanium oxide, or titanium nitride, or an organic material, such as polyimide, polyester, or acryl. In an embodiment, the buffer film 211 may be formed by alternately stacking the inorganic material and the organic material. The buffer film 211 is not an essential component, and may not be included as occasion demands. The buffer film 211 may be formed via any one of various deposition methods, such as a plasma enhanced chemical vapor deposition (PECVD) method, an atmospheric pressure CVD (APCVD) method, and a low pressure CVD (LPCVD) method.

The display portion 22 may include a display device forming an image. The display device may include a liquid crystal device, an electrophoretic device, or an organic light-emitting device (OLED), and a thin-film transistor (TFT) that drives the liquid crystal device, the electrophoretic device, or the organic light-emitting device. In an embodiment, the display device may include an OLED.

A plurality of TFTs may be included in the display device. In an embodiment, two types of TFTs may be included.

A first TFT TFT1 may include a first active layer 212*a*, a first gate electrode 214*a*, a first source electrode 216*a*, and a first drain electrode 217*a*. A first gate insulating film 213*a* and a second gate insulating film 213*b* for insulating the first gate electrode 214*a* and the first active layer 212*a* may be disposed between the first gate electrode 214*a* and the first active layer 212*a*.

A second TFT TFT2 may include a second active layer 212*b*, a second gate electrode 214*b*, a second source electrode 216*b*, and a second drain electrode 217*b*. The first gate insulating film 213*a* for insulating the second gate electrode 214*b* and the second active layer 212*b* may be disposed between the second gate electrode 214*b* and the second active layer 212*b*.

The first TFT TFT1 may be different from the second TFT TFT2 in that the first TFT TFT1 may further include the second gate insulating film 213*b* between an active layer and a gate electrode. The first TFT TFT1 may have a thicker gate insulating film than the second TFT TFT2. The first TFT TFT1 may be the thicker gate insulating film, and a driving range of a gate voltage applied to a gate electrode may be wider.

The first TFT TFT1 may be a driving TFT that drives the OLED. A wide driving range of a driving TFT means that a light emitted from an OLED may be controlled to have abundant gradation.

The first gate electrode 214*a* and the second gate electrode 214*b* may not be formed on the same layer. The first and second TFTs TFT1 and TFT2 may not interfere with each other even when they are adjacently disposed, and more devices may be disposed in the same area.

The first and second active layers 212*a* and 212*b* may be prepared on the buffer film 211. The first and second active layers 212*a* and 212*b* may be formed of an inorganic semiconductor, such as amorphous silicon or polysilicon, or an organic semiconductor. In some embodiments, the first active layer 212*a* may be formed of an oxide semiconductor. The oxide semiconductor may include an oxide of a material selected from 12-Group, 13-Group, and 14-Group metal elements, such as zinc (Zn), indium (In), gallium (Ga), tin (Sn), cadmium (Cd), germanium (Ge), and hafnium (Hf), and combinations thereof.

The first gate insulating film 213*a* may be prepared on the buffer film 211, and may cover the first and second active layers 212*a* and 212*b*.

The second gate electrode 214*b* may be formed to partially overlap the second active layer 212*b* on the first gate insulating film 213*a*.

The second gate insulating film 213*b* may be formed while covering the second gate electrode 214*b*.

The first gate electrode 214*a* may be formed to partially overlap the first active layer 212*a* on the second gate insulating film 213*b*.

The first and second gate electrodes 214*a* and 214*b* may include a single layer or multilayer of gold (Au), silver (Ag), copper (Cu), nickel (Ni), platinum (Pt), palladium (Pd), aluminum (Al), molybdenum (Mo), chromium (Cr), or may include an alloy, such as Al:Nd or Mo:W.

The first and second gate insulating film 213*a* and 213*b* may include an inorganic film formed of silicon oxide, silicon nitride, or a metal oxide, and may be formed in a single layer or multilayer of the inorganic film.

An interlayer insulating film 215 may be formed to cover the first gate electrode 214*a*. The interlayer insulating film 215 may be an inorganic film formed of silicon oxide or silicon nitride. The interlayer insulating film 215 may include an organic film.

The first source electrode 216*a* and the first drain electrode 217*a* may be formed on the interlayer insulating film 215 to respectively contact the first active layer 212*a* through contact holes. The second source electrode 216*b* and the second drain electrode 217*b* may be formed on the interlayer insulating film 215 to respectively contact the second active layer 212*b* through contact holes. The first source electrode 216*a*, the second source electrode 216*b*, the first drain electrode 217*a*, and the second drain electrode 217*b* may include a metal ally, a metal nitride, a conductive metal oxide, or a transparent conductive material.

In an embodiment, the TFT may have a top gate structure. In an embodiment, the TFT may have a bottom gate structure wherein the first gate electrode 214*a* may be disposed below the first active layer 212*a*.

The display portion 22 may include a capacitor 230. The capacitor 230 may store a data signal supplied to the display device, or may compensate for a voltage drop of the display device.

The capacitor 230 may include a first capacitor electrode 230*a*, a second capacitor electrode 230*b*, and second gate insulating film 213 between the first and second capacitor electrodes 230*a* and 230*b*. The first capacitor electrode 230*a* may be formed of the same material as the second gate electrode 214*b*, and the second capacitor electrode 230*b* may be formed of the same material as the first gate electrode 214*a*.

A planarization film 218 may cover the first and second TFTs TFT1 and TFT2 and the capacitor 230, and may be disposed on the interlayer insulating film 215. The planarization film 218 may remove a stepped portion of the interlayer insulating film 215 and may increase light-emitting efficiency of the OLED that may be formed on the planarization film 218. Also, the planarization film 218 may have a through hole that may expose a part of the first drain electrode 217*a*.

The planarization film 218 may be formed of an insulating material. For example, the planarization film 218 may have a structure including a single layer or a plurality of layers formed of an inorganic material, an organic material, or an organic/inorganic compound, and may be formed via any one of various deposition methods. In some embodiments, the planarization film 218 may be formed of at least one material selected from polyacrylates resin, epoxy resin, phenolic resin, polyamides resin, polyimides resin, unsaturated polyesters resin, polyphenylenethers resin, polyphenylenesulfides resin, and benzocyclobutene (BCB).

In an embodiment, any one of the planarization film 218 and the interlayer insulating film 215 may not be included as occasion demands.

The OLED may be disposed on the planarization film 218, and may include a first electrode 221, an intermediate layer 220 that may include an organic emission layer, and a second electrode 222. A pixel-defining film 219 may be disposed to cover a part of the planarization film 218 and a part of the first electrode 221, and may define a pixel area PA and a non-pixel area NPA.

Holes and electrons injected from the first and second electrodes 221 and 222 of the OLED may combine with each other in the organic emission layer of the intermediate layer 220, an light may be generating.

The intermediate layer 220 may include the organic emission layer. In an embodiment, the intermediate layer 220 may include the organic emission layer, and may further include at least one selected from a hole injection layer (HIL), a hole transport layer (HTL), an electron transport layer (ETL), and an electron injection layer (EIL). In an embodiment, the intermediate layer 220 may include the organic emission layer and further include other various functional layers.

The second electrode 222 may be formed on the intermediate layer 220. The second electrode 222 may form an electric field with the first electrode 221, and light may be emitted from the intermediate layer 220. The first electrode 221 may be patterned according to pixels, and the second electrode 222 may be formed such that a common voltage may be applied to all pixels. The second electrode 222 may be electrically connected to a power supply wire 240 and a circuit wire 241 that may be disposed on an edge of the display portion 22.

The first and second electrodes 221 and 222 may each be a transparent electrode or a reflective electrode. In an embodiment, the first electrode 221 may operate as an anode and the second electrode 222 may operate as a cathode. In an embodiment, the first electrode 221 may operate as a cathode and the second electrode 222 may operate as an anode.

In FIG. 2, only one OLED is illustrated, but the display portion 22 (refer to FIG. 1) may include a plurality of OLEDs. Each OLED may form one pixel, and multiple pixels may form a red, green, blue, or white color.

In an embodiment, the intermediate layer 220 may be commonly formed throughout the first electrode 221 regardless of the locations of pixels. The organic emission layer may be formed, for example, as layers that may include emission materials emitting red, green, and blue lights that may be perpendicularly stacked on each other, or as emission materials emitting red, green, and blue lights that may be mixed with each other. Other colors may be combined as long as white light may be emitted.

The display apparatus 100 may further include a color converting layer or a color filter, which may convert emitted white light to a predetermined color.

A protection layer (not shown) may be disposed on the second electrode 222, and may cover and protect the OLED. The protection layer may include an inorganic insulating film and/or an organic insulating film.

A spacer 223 may be disposed in the non-pixel area NPA, and may maintain an interval between the display substrate 21 and the sealing substrate 23 by being disposed between the display substrate 21 and the sealing substrate 23. The spacer 223 may be provided to prevent a display characteristic from being deteriorated by an external shock.

In some embodiments, the spacer 223 may be provided on the pixel-defining film 219. The spacer 223 may protrude from the pixel-defining film 219 towards the sealing substrate 23. In some embodiments, the pixel-defining film 219 and the spacer 223 may be integrally formed via a photography process or a photo-etching process by using a photo-sensitive material. The pixel-defining film 219 and the spacer 223 may be simultaneously formed by adjusting an exposure amount via an exposure process, by using a half-tone mask.

The second electrode 222 and/or the protection layer may be disposed on the spacer 223.

The sealing portion 30 may be disposed while surrounding the display portion 22. The sealing portion 30 may be a portion where the display substrate 21 and the sealing substrate 23 may be bonded to each other, may prevent oxygen or moisture from penetrating into the display portion 22, and may improve apparatus intensity by bonding the display substrate 21 and the sealing substrate 23.

The sealing portion 30 may include the first sealing portion 31 adjacent to the display portion 22, and the second sealing portion 33 that may be disposed outside the first sealing portion 31.

The sealing material 330 may be disposed in the first sealing portion 31. The sealing material 330 may be formed of a material that may be hardened by a laser beam. In some embodiments, the sealing material 330 may be an inorganic material. For example, the sealing material 330 may be frit. The sealing material 330 may be applied by using a dispenser or a screen printing method. Frit generally means a glass raw material in power form, but in an embodiment, frit may be in a paste form in which a laser or infrared light absorber, an organic binder, and a filler for decreasing a thermal expansion coefficient may be included in a main material, such as $SiO_2$. Frit in a paste form may be hardened as an organic binder and moisture may be removed via a drying or sintering process. The laser or infrared light absorber may include a transition metal compound. An example of a thermal source for bonding the display substrate 21 and the sealing substrate 23 by hardening the sealing material 330 may include a laser beam.

The bonding assistant layer 325 for reinforcing the bonding between the sealing material 330 and the display substrate 21 may be further disposed in the sealing portion 30. The bonding assistant layer 325 may include the insulating layer 320 including the at least one first opening 320*a*. Also, the bonding assistant layer 325 may include the metal pattern layer 310.

The insulating layer 320 may include the at least one first opening 320*a*. An upper portion of the display substrate 21, buffer film 211, or first gate insulating film 213*a* may be exposed by the first opening 320*a*. A plurality of the first openings 320*a* may be formed. The first opening 320*a* may be formed to increase a contact area between the sealing material 330 and the insulating layer 320. Accordingly, bonding intensity between the sealing material 330 and the insulating layer 320 may be increased.

The insulating layer 320 may include a first insulating layer 321 and a second insulating layer 323. In an embodiment, the insulating layer 320 may only include the first insulating layer 320 or may include at least three layers.

The first insulating layer 321 may be formed of the same material and on the same layer as the second gate insulating film 213b. The second insulating layer 323 may be formed of the same material and on the same layer as the interlayer insulating film 215.

The metal pattern layer 310 may transfer heat to the sealing material 330, for example, by absorbing heat of a laser beam or by reflecting a laser beam. The metal pattern layer 310 may include at least one second opening 310a. A top portion of the display substrate 21, buffer film 211, or first gate insulating film 213a may be exposed by the second opening 310a.

The sealing material 330 may be frit, adhesive strength with the display substrate 21, buffer film 211, or first gate insulating film 213a may be stronger than the metal pattern layer 310, the metal pattern layer 310 may include the second opening 310a, and the sealing material 330 may be directly adhered to the display substrate 21, buffer film 211, or first gate insulating film 213a.

The first opening 320a of the insulating layer 320 may be formed inside the second opening 310a of the metal pattern layer 310, and the first opening 320a may be smaller than the second opening 310a. Accordingly, bonding intensity may be increased as the sealing material 330 may contact a side wall of the first opening 320a of the insulating layer 320 without directly contacting a metal of the metal pattern layer 310.

The metal pattern layer 310 may be formed of the same material and on the same layer as the first gate electrode 214a of the first TFT TFT1. In an embodiment, the metal pattern layer 310 may be formed of the same material and on the same layer as the second gate electrode 214b of the second TFT TFT2. In some embodiments, the metal pattern layer 310 may be a single layer or multilayer including Au, Ag, Cu, Ni, Pt, Pd, Al, Mo, or Cr. In some embodiments, the metal pattern layer 310 may include an alloy, such as Al:Nd or Mo:W.

The metal pattern layer 310 may be disposed between the display substrate 21 and the insulating layer 320. The insulating layer 320 may be disposed on the metal pattern layer 310, and a hillock phenomenon and bubble generation near the metal pattern layer 310, which may be caused by a rapid temperature increase by a laser beam, may be prevented.

The second sealing portion 33 may be disposed outside the first sealing portion 31. Outside of the first sealing portion 31 may denote a direction where the display portion 22 is not disposed based on the first sealing portion 31.

The second sealing portion 33 may include the gas hole 33a connected to the first opening 320a. A top portion of the display substrate 21, buffer film 211, or first gate insulating film 213a may be exposed by the gas hole 33a.

As shown in FIG. 3, the first opening 320a may be connected to the gas hole 33a via a connection hole 320b. The gas hole 33a may be used to exhaust a gas generated in the first sealing portion 31 while hardening the sealing material 330.

While hardening the sealing material 330, a gas may be generated in a region of the first sealing portion 31, and if the gas is trapped, bubbles may be generated inside the sealing material 330. Such bubbles may weaken the adhesive strength between the sealing material 330 and the display substrate 21. The gas hole 33a may be configured to prevent bubbles from being generated, and may exhaust a gas generated while hardening the sealing material 330.

A process of hardening the sealing material 330 may be performed while a vacuum state is maintained, and a gas generated during the process may be easily exhausted.

The plurality of the first openings 320a may be formed, and the adjacent first openings 320 may be connected to each other via the connection hole 320b. The first opening 320a adjacent to the gas hole 33a may be connected to the gas hole 33a via the connection hole 320b. Each of the first openings 320a may be directly or indirectly connected to the at least one gas hole 33a.

In some embodiments, an area of the gas hole 33a may be larger than an area of the first opening 320a. The area of the gas hole 33a may be designed such that a gas generated while hardening the sealing material 330 may be efficiently exhausted.

The additional sealing material 350 may be disposed in the second sealing portion 33. The additional sealing material 350 may be included, and the gas hole 33a may be filled by the additional sealing material 350. The gas hole 33a may reinforce the bonding intensity, for example, by increasing a contact area between the additional sealing material 350 and the display substrate 21.

The additional sealing material 350 may be formed of a material that may have an adhesive strength that may assist the bonding intensity of the sealing material 330. In some embodiments, the additional sealing material 350 may be formed of an organic sealant, such as urethane-based resin, epoxy-based resin, or acryl-based rein, or an inorganic sealant, such as silicon. An example of a urethane-based resin is urethane acrylate. Examples of an acryl-based resin include butylacrylate and ethylhexylacrylate. In some embodiments, the additional sealing material 350 may be a material that may be hardened by heat.

Figure 4:
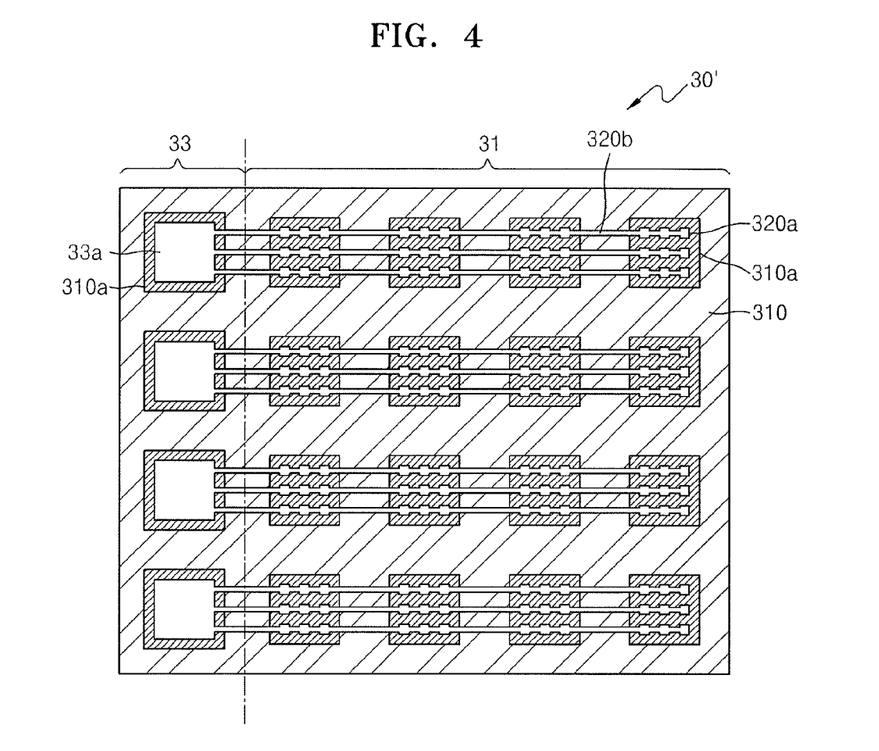
FIG. 4 illustrates a plan view of a sealing portion of a display apparatus, according to another embodiment.

FIG. 4 illustrates a plan view of a sealing portion 30' of a display apparatus, according to another embodiment. In FIGS. 3 and 4, like reference numerals denote like elements, and overlapping details are not repeated.

Referring to FIG. 4, the plurality of first openings 320a of the insulating layer 320 may be formed in one second opening 310a of the metal pattern layer 310.

The number of the first openings 320a may increase, an area where the side walls of the first openings 320a and the sealing material 330 contact each other may increase, and the bonding intensity may increase. The number and area of the first openings 320a may be designed while considering an area and process yield ratio of the first opening 320a into which the sealing material 330 may be penetrable.

Figure 5:
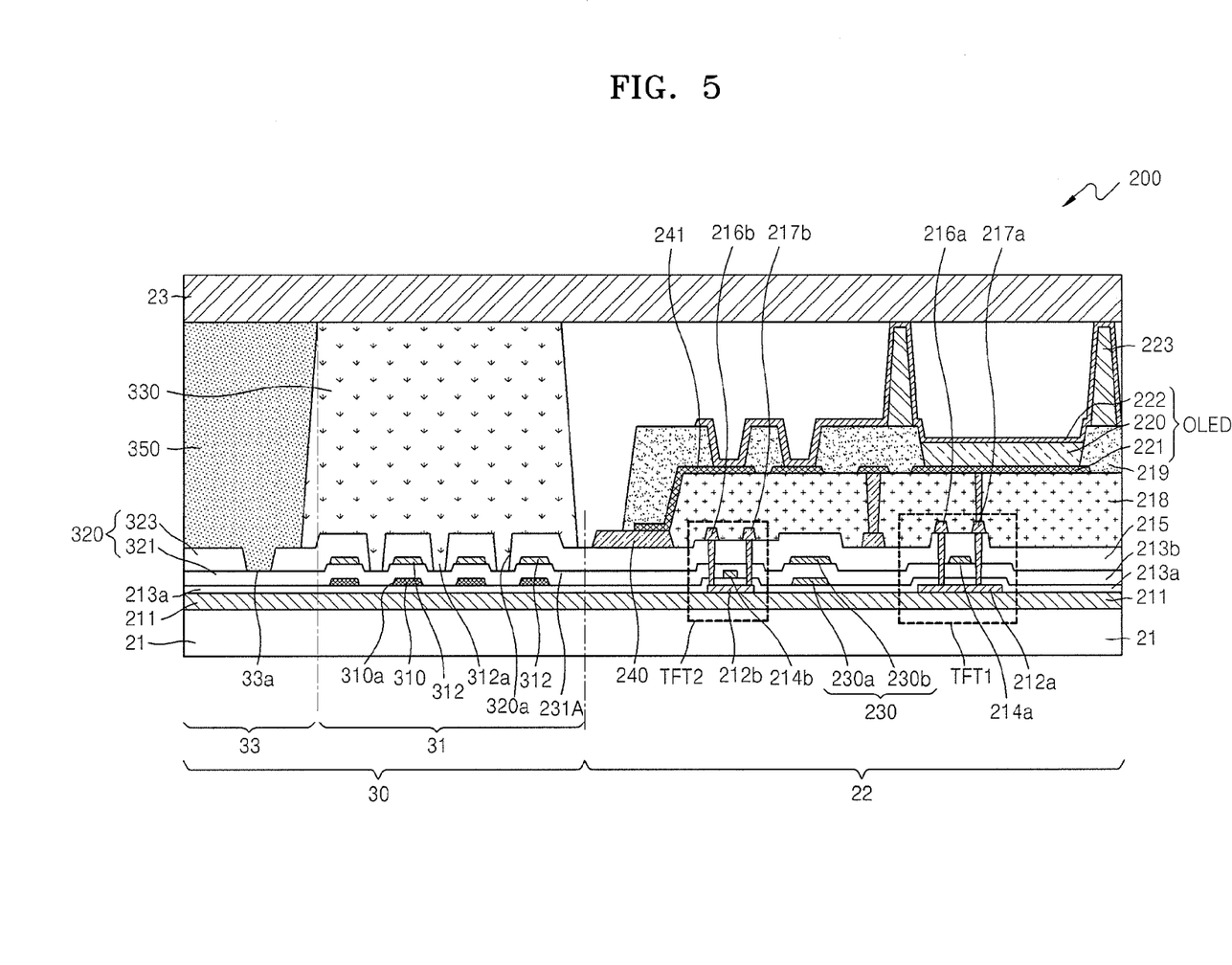
FIG. 5 illustrates a cross-sectional view of a display apparatus according to another embodiment.

FIG. 5 illustrates a cross-sectional view of a display apparatus 200 according to another embodiment.

In FIGS. 2 and 5, like reference numerals denote like elements, and overlapping details are omitted for simplification of description. In detail, the description about the display portion 22 of FIG. 5 is replaced by that of FIG. 2.

Referring to FIG. 5, the display apparatus 200 may include the display substrate 21 that may have the display portion 22, the sealing substrate 23, and the sealing portion 30 that bonds the display substrate 21 and the sealing substrate 23.

The sealing portion 30 may include the first sealing portion that may include the sealing material 330 and the insulating layer 320 that may include the at least one first opening 320a, and the second sealing portion 33 that may include the at least one gas hole 33a that may be disposed outside the first sealing portion 31.

The at least one first opening 320a may be connected to the at least one gas hole 33a via the connection hole 320b of FIG. 3 or 4. The gas hole 33a may be used to exhaust a gas generated while hardening the sealing material 330.

In the display apparatus 200 according to an embodiment, a second metal pattern layer 312 may additionally be formed in the first sealing portion 31.

The metal pattern layer 310 may include the at least one second opening 310a. The top portion of the display substrate 21, buffer film 211, or first gate insulating film 213a may be exposed by the second opening 310a.

The second metal pattern layer 312 may include at least one third opening 312a. The top portion of the display substrate 21, buffer film 211, or first gate insulating film 213a may be exposed by the third opening 312a.

The sealing material 330 may be frit, adhesive strength with the display substrate 21, the buffer film 211, or the first gate insulating film 213a may be stronger than that with the metal pattern layer 310 or the second metal pattern layer 312, and the second or third opening 310a or 312a may be formed such that the sealing material 330 may be directly adhered to the display substrate 21, the buffer film 211, or the first gate insulating film 213a. In some embodiments, the second and third openings 310a and 312a may overlap each other.

The second metal pattern layer 312 may be formed of the same material and on the same layer as the first gate electrode 214a of the first TFT TFT1. The metal pattern layer 310 may be formed of the same material and on the same layer as the second gate electrode 214b of the second TFT TFT2. In some embodiments, the second metal pattern layer 312 may be a single layer or a multilayer including Au, Ag, Cu, Ni, Pt, Pd, Al, Mo, or Cr. In some embodiments, the second metal pattern layer 312 may include an alloy, such as Al:Nd or Mo:W.

The second insulating layer 323 may be further disposed on the metal pattern layer 310 and the second metal pattern layer 312. The second insulating layer 323 may have a single or multilayer structure.

The second insulating layer 323 may be disposed on the metal pattern layer 310 and the second metal pattern layer 312, and the second metal pattern layer 312 may prevent a hillock phenomenon and bubble generation caused by a rapid temperature increase by a laser beam.

The first insulating layer 321 may be disposed between the metal pattern layer 310 and the second metal pattern layer 312. The first insulating layer 321 may have a single or multilayer structure.

The first insulating layer 321 and the second insulating layer 323 are together called the insulating layer 320. The insulating layer 320 includes the at least one first opening 320a. The first opening 320a may be formed by simultaneously penetrating through the first and second insulating layers 321 and 323.

In some embodiments, the first opening 320a may have a smaller area than the second opening 310a. In some embodiments, the plurality of first openings 320a may be formed inside the second or third opening 310a or 312a.

The first insulating layer 321 may be formed of the same material and on the same layer as the second gate insulating film 213b. The second insulating layer 323 may be formed of the same material and on the same layer as the interlayer insulating film 215.

Figure 6A:
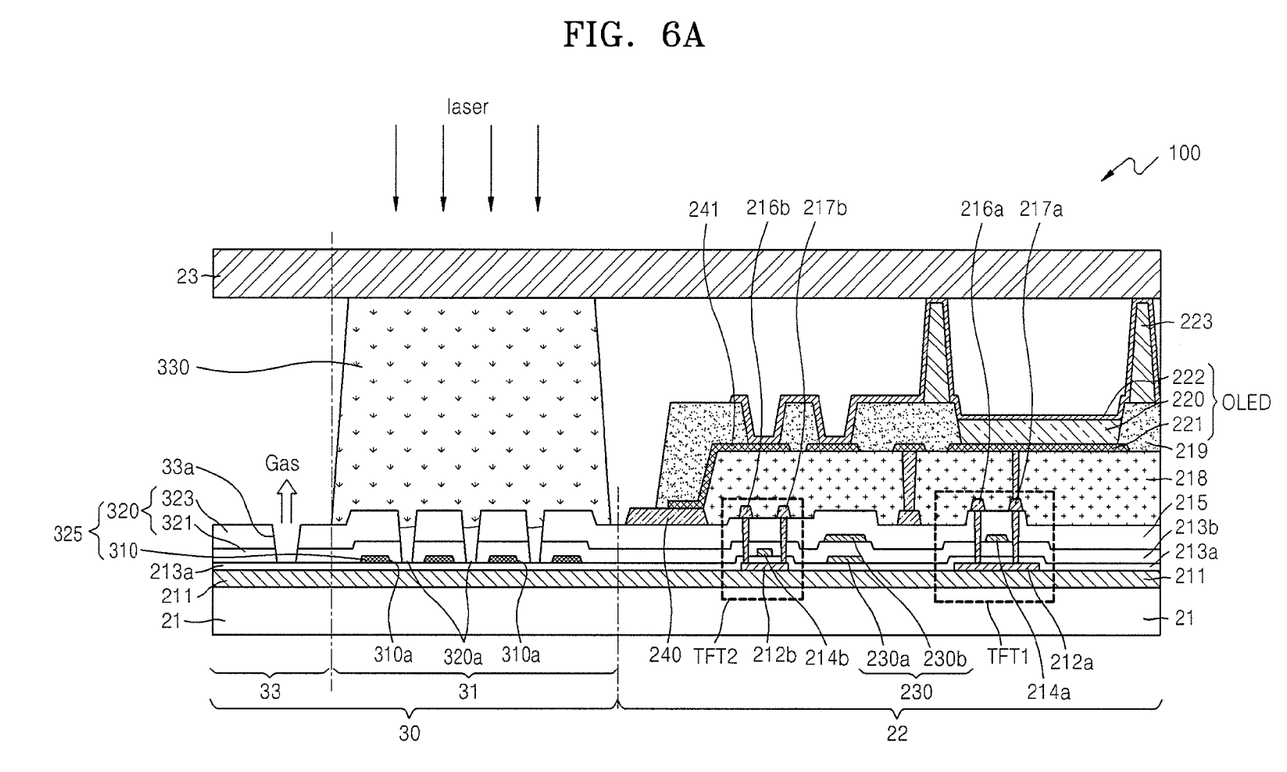
FIGS. 6A through 6C illustrate cross-sectional views for sequentially describing a method of manufacturing a display apparatus, according to an embodiment.
Figure 6B:
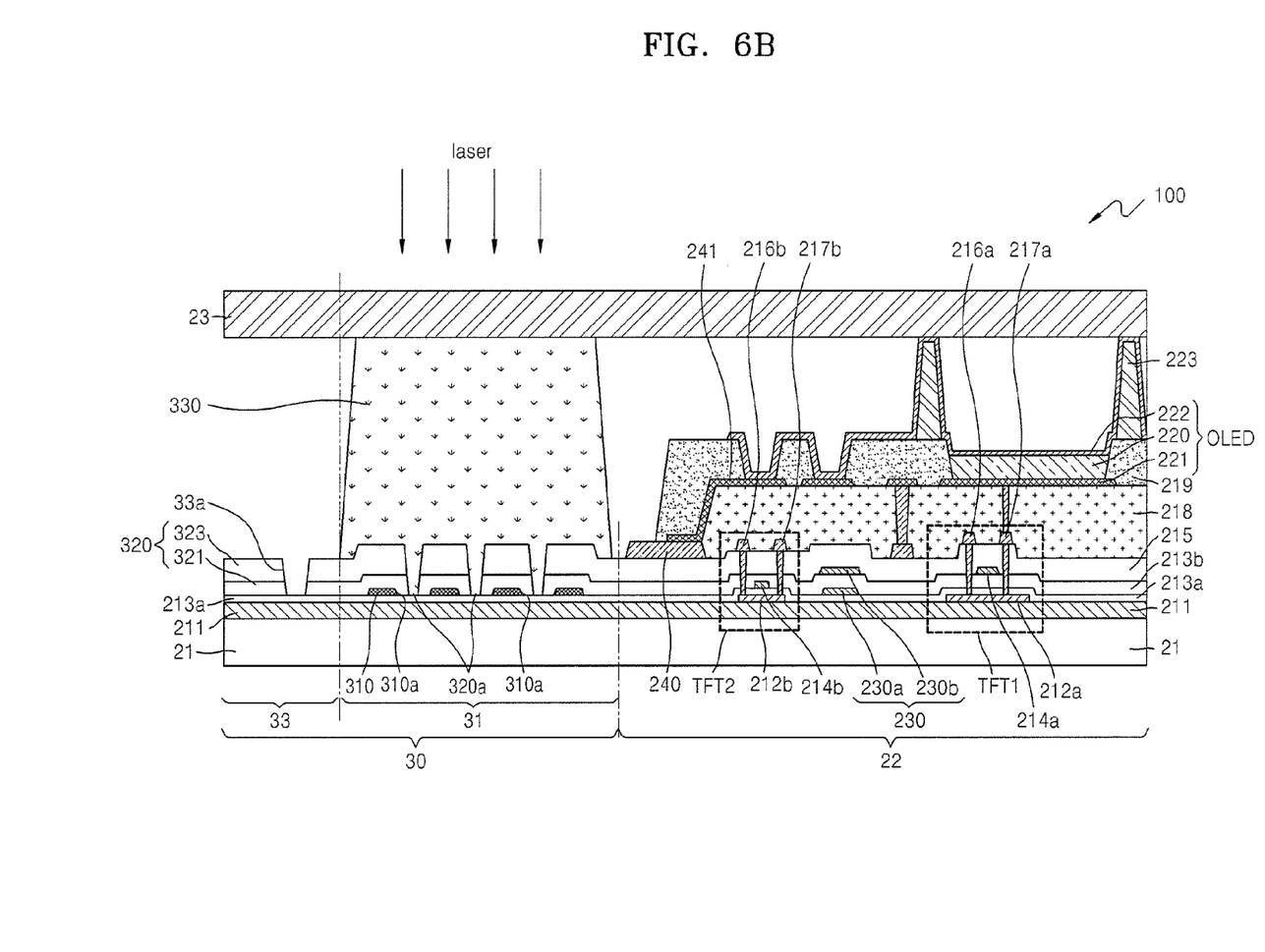
Figure 6C:
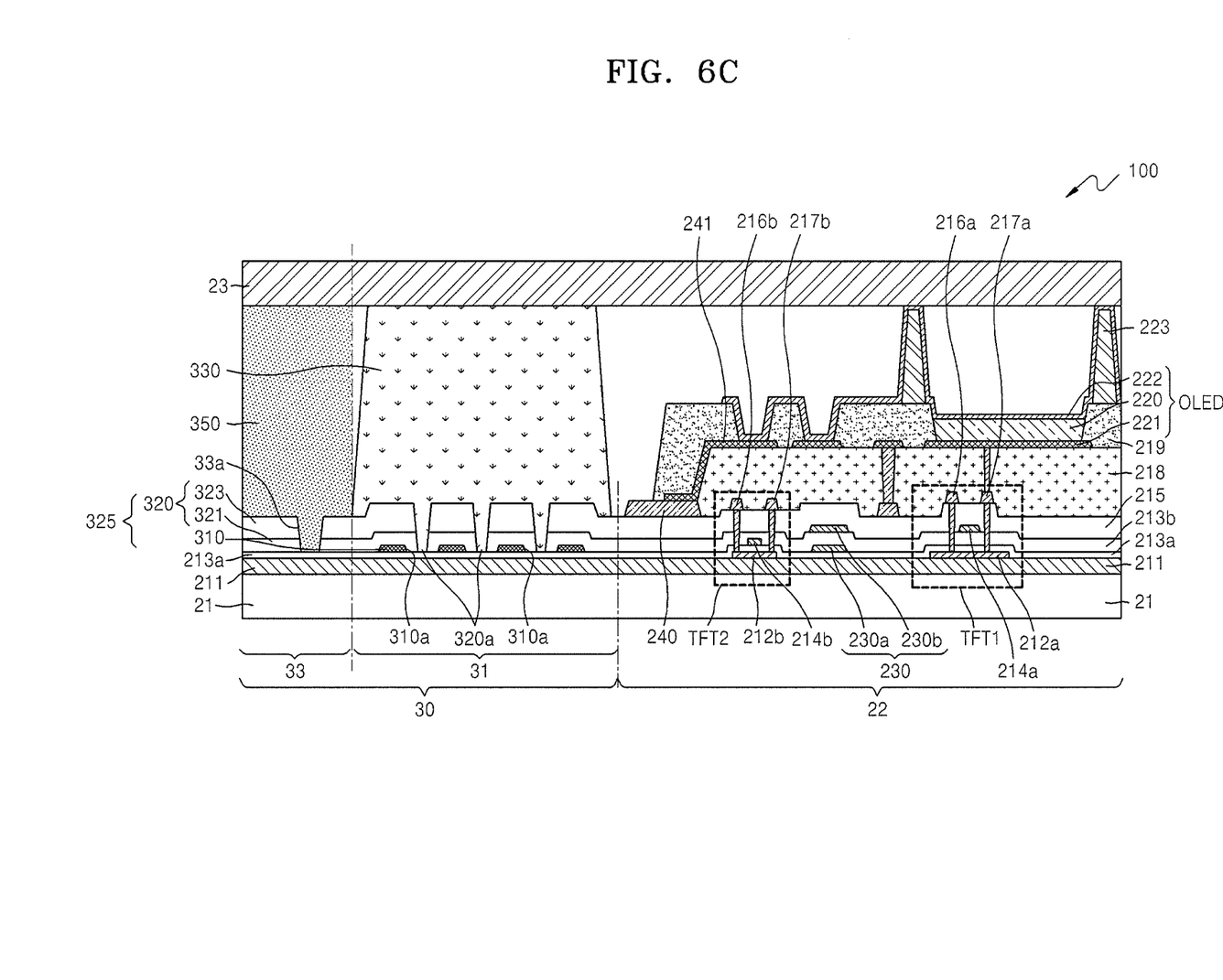

FIGS. 6A through 6C illustrate cross-sectional views for sequentially describing a method of manufacturing the display apparatus 100 or 200, according to an embodiment. In an embodiment, the display apparatus 100 of FIG. 2 is manufactured.

Referring to FIG. 6A, the display portion 22 including display devices, such as the OLED, the first TFT TFT1, and the second TFT TFT2, is formed on the display substrate 21.

While forming the display portion 22, the insulating layer 320 that may have the at least one first opening 320a may be formed in the first sealing portion 31 surrounding the display portion 22, and the gas hole 33a may be formed in the second sealing portion 33 that may be disposed outside the first sealing portion 31.

Before forming the insulating layer 320, the metal pattern layer 310 that may have the second opening 310a that may be disposed below the insulating layer 320 may be formed in the first sealing portion 31.

Then, the sealing material 330 is applied on the first sealing portion 31. The sealing material 330 may be applied via a dispenser or a screen printing method. The sealing material 330 may include frit.

Then, the sealing substrate 23 may be disposed to face the display substrate 21, and the sealing material 330 may be hardened by irradiating a laser beam on the sealing substrate 23. The sealing material 330 may be hardened under a vacuum atmosphere. In other words, a process of bonding the display substrate 21 and the sealing substrate 23 may be performed under a vacuum atmosphere (for example, pressure lower than or equal to 100 Pa) that is lower than an atmospheric pressure. Accordingly, a gas generated during the hardening may be easily exhausted.

The sealing material 330 may be hardened, and a gas may be generated in the sealing material 330. Such a gas may be exhausted through the first opening 320a of the first sealing portion 31 and the gas hole 33a of the second sealing portion 33, which may be connected to the first opening 320a.

Referring to FIG. 6B, as the gas on the first sealing portion 31 may be exhausted, the sealing material 330 may fill and may be hardened in the first opening 320a. Accordingly, the sealing material 330, the insulating layer 320, and the display substrate 21 may be bonded to each other.

Referring to FIG. 6C, the additional sealing material 350 may be applied and hardened on the second sealing portion 33, and the display apparatus 100 may be completed. The additional sealing material 350 may fill the gas hole 33a, and the bonding intensity may be increased.

As described above, according to the one or more of the above embodiments, a display apparatus may include a sealing portion for bonding a display substrate and a sealing substrate.

The sealing portion may include a gas hole through which a gas that may be generated in a sealing material during a process may be exhaustible, and bubbles may not be formed in the sealing portion. Accordingly, bonding intensity between the display substrate and the sealing substrate may be increased.

By way of summation and review, display apparatus that include TFTs need to be sealed to protect a display device from an external environment. A plurality of substrates may be bonded to each other by applying a sealing material between the plurality of substrates and hardening the sealing material by irradiating a laser beam from, for example, a laser. When the display apparatus is sealed using a laser, bubbles may be generated in the sealing material due to non-uniform energy of light reaching the sealing member, and the plurality of substrates may be bonded unevenly.

The embodiments disclosed herein address these considerations.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
    a display substrate arranged with a display portion including a display device;
    a sealing substrate disposed to face the display substrate; and
    a sealing portion that bonds the display substrate and the sealing substrate and surrounds the display portion, the sealing portion including:
    a first sealing portion that includes a sealing material and an insulating layer that includes at least one first opening; and
    a second sealing portion that is disposed outside the first sealing portion and includes at least one gas hole passing through the insulating layer, wherein the insulating layer is disposed over a lower insulating layer, and the first opening exposes the lower insulating layer.

2. A display apparatus, comprising:
    a display substrate arranged with a display portion including a display device;
    a sealing substrate disposed to face the display substrate; and
    a sealing portion that bonds the display substrate and the sealing substrate and surrounds the display portion, the sealing portion including:
    a first sealing portion that includes a sealing material and an insulating layer that includes at least one first opening; and
    a second sealing portion that is disposed outside the first sealing portion and includes at least one gas hole, wherein the at least one first opening is connected to the at least one gas hole by a connection hole.

3. The display apparatus as claimed in claim 2, wherein an area of the at least one gas hole is larger than an area of the at least one first opening.

4. The display apparatus as claimed in claim 2, wherein:
    the insulating layer includes a plurality of first insulating layer openings, and
    each of the first insulating layer openings is connected to an adjacent first opening through a connection hole.

5. The display apparatus as claimed in claim 2, wherein the first sealing portion further includes a metal pattern layer including at least one second opening.

6. The display apparatus as claimed in claim 5, wherein the insulating layer includes a plurality of first openings that are formed inside the second opening.

7. The display apparatus as claimed in claim 5, wherein:
    the display portion includes a thin-film transistor including an active layer, a gate electrode, a source electrode, and a drain electrode, and
    the metal pattern layer is formed of a same material and on a same layer as the gate electrode.

8. The display apparatus as claimed in claim 5, wherein:
    the display portion including a first thin-film transistor including a first active layer, a first gate electrode, a first source electrode, and a first drain electrode, and a second thin-film transistor including a second active layer, a second gate electrode, a second source electrode, and a second drain electrode,
    a gate insulating film is disposed between the first gate electrode and the second gate electrode, and
    the metal pattern layer includes a same material and a same layer as the first or second gate electrode.

9. The display apparatus as claimed in claim 2, wherein the first sealing portion further includes:
    a first metal pattern layer includes at least one second opening; and
    a second metal pattern layer including a third opening on the first metal pattern layer.

10. The display apparatus e as claimed in claim 9, wherein:
    the display portion includes a first thin-film transistor including a first active layer, a first gate electrode, a first source electrode, and a first drain electrode, and a second thin-film transistor including a second active layer, a second gate electrode, a second source electrode, and a second drain electrode,
    a gate insulating film is disposed between the first gate electrode and the second gate electrode,
    the first metal pattern layer is formed of a same material and on a same layer as the first gate electrode, and
    the second metal pattern layer is formed of a same material and on a same layer as the second gate electrode.

11. The display apparatus as claimed in claim 2, wherein the sealing material is hardened by a laser.

12. The display apparatus as claimed in claim 2, wherein an additional sealing material is disposed on the second sealing portion.

13. The display apparatus as claimed in claim 2, wherein the sealing substrate overlaps the at least one gas hole.

* * * * *